US012596259B2

(12) United States Patent
Kim et al.

(10) Patent No.: US 12,596,259 B2
(45) Date of Patent: Apr. 7, 2026

(54) HEAD-MOUNTED DISPLAY DEVICE

(71) Applicant: SAMSUNG DISPLAY CO., LTD., Yongin-si (KR)

(72) Inventors: Dae Won Kim, Yongin-si (KR); Su Jeong Kim, Yongin-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 0 days.

(21) Appl. No.: 18/596,507

(22) Filed: Mar. 5, 2024

(65) Prior Publication Data

US 2024/0427148 A1      Dec. 26, 2024

(30) Foreign Application Priority Data

Jun. 23, 2023      (KR) ......................... 10-2023-0081108

(51) Int. Cl.
| | |
|---|---|
| *G02B 27/01* | (2006.01) |
| *G02B 5/30* | (2006.01) |
| *G02B 27/12* | (2006.01) |
| *H10K 59/38* | (2023.01) |
| *H10K 59/80* | (2023.01) |

(52) U.S. Cl.
CPC ....... *G02B 27/0172* (2013.01); *G02B 5/3016* (2013.01); *G02B 27/123* (2013.01); *H10K 59/38* (2023.02); *H10K 59/873* (2023.02); *H10K 59/8793* (2023.02); *G02B 2027/013* (2013.01)

(58) Field of Classification Search
CPC .............. G02B 27/0172; G02B 5/3016; G02B 27/123; G02B 2027/013; G02B 2027/0178; G02B 3/00; G02B 5/3025; G02B 5/3083; G02B 2003/0093; H10K 59/38; H10K 59/873; H10K 59/8793; H10K 59/80518; H10K 59/8052; H10K 59/87; H10K 59/879; G02F 1/133543; G02F 1/13363
See application file for complete search history.

(56) References Cited

U.S. PATENT DOCUMENTS

| | | | |
|---|---|---|---|
| 2018/0120579 A1 | 5/2018 | Gollier et al. | |
| 2019/0377176 A1* | 12/2019 | Sharp ................... | G02B 5/3016 |
| 2023/0129724 A1* | 4/2023 | Lee ....................... | G02B 27/144 |
| | | | 359/485.01 |

FOREIGN PATENT DOCUMENTS

| | | |
|---|---|---|
| KR | 10-2016-0015355 A | 2/2016 |
| KR | 10-2019-0116193 A | 10/2019 |
| KR | 10-2022-0128478 A | 9/2022 |

* cited by examiner

*Primary Examiner* — Amit Chatly

(74) *Attorney, Agent, or Firm* — F. CHAU & ASSOCIATES, LLC

(57) ABSTRACT

According to embodiments, a head-mounted display device includes a display panel, and an optical system disposed in front of the display panel. The display panel includes a light emitting device unit, three cholesteric layers disposed on the front surface of the light emitting device unit, an upper light blocking layer disposed between two cholesteric layers, a retardation plate disposed on front surfaces of the cholesteric layers, an absorption-type polarizer disposed in front of the retardation plate. Each cholesteric layers have different wavelength values according to the following equation:

wavelength=$n$×pitch value where, n is a refractive index value, and the pitch value is a pitch value of liquid crystal molecules of the cholesteric layers.

14 Claims, 12 Drawing Sheets

HEAD-MOUNTED DISPLAY DEVICE

CROSS-REFERENCE TO RELATED APPLICATION

This application claims priority under 35 U.S.C. § 119 to and the benefit of Korean Patent Application No. 10-2023-0081108, filed in the Korean Intellectual Property Office on Jun. 23, 2023, the entire contents of which are incorporated by reference.

TECHNICAL FIELD

The present disclosure relates to a head-mounted display device, and more particularly, to a head-mounted display device.

DESCRIPTION OF THE RELATED ART

A light emitting display device is a self-emitting display device that displays an image by emitting light from a light emitting diode. Such a light emitting display device is included in various electronic devices. To enhance the user experience with a three-dimensional effect or immersion, a head-mounted display device that displays an image directly in front of the user is also widely distributed.

However, the head-mounted display device may have a reduced light efficiency when a polarizer is used.

SUMMARY

Embodiments are to provide a head-mounted display device.

A head-mounted display device includes a display panel, and an optical system disposed in front of the display panel. The display panel includes: a light emitting device unit, a first cholesteric liquid crystal layer, a second cholesteric liquid crystal layer, and a third cholesteric liquid crystal layer disposed on the front surface of the light emitting device unit, an upper light blocking layer disposed between two of the first cholesteric liquid crystal layer, the second cholesteric liquid crystal layer, and the third cholesteric liquid crystal layer, a retardation plate disposed on front surfaces of the first cholesteric liquid crystal layer, the second cholesteric liquid crystal layer, the third cholesteric liquid crystal layer, and the upper light blocking layer, and an absorption-type polarizer disposed in front of the retardation plate. The first cholesteric liquid crystal layer, the second cholesteric liquid crystal layer, and the third cholesteric liquid crystal layer have different wavelength values according to the following equation:

$$\text{wavelength} = n \times \text{pitch value}$$

where, n is a refractive index value, and the pitch value is a pitch value of liquid crystal molecules of the first cholesteric liquid crystal layer, the second cholesteric liquid crystal layer, or the third cholesteric liquid crystal layer.

A head-mounted display includes a display panel, and an optical system disposed in front of the display panel. The display panel includes a light emitting device unit, a retardation plate disposed in front of the light emitting device unit, and a reflective polarizing plate for a display device disposed in front of the retardation plate. The optical system includes a first curved lens including a first retardation plate disposed on an inner surface and a beam splitter disposed on an outer surface, and a second curved lens including a second retardation plate disposed on an inner surface and a reflective polarizing plate disposed on an outer surface. The first curved lens is disposed on the display panel, and the second curved lens is disposed on the first curved lens. The light emitting device unit emits circularly polarized light.

DETAILED DESCRIPTION

Figure 1:
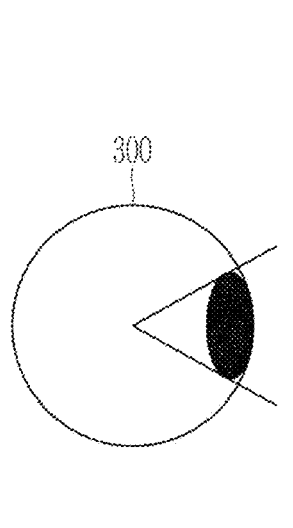
FIG. 1 is a schematic cross-sectional view of a head-mounted display device according to an embodiment.
Figure 1:
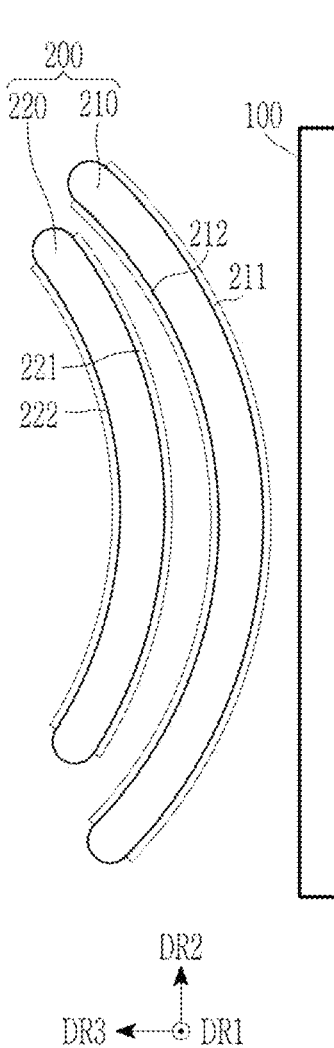

Hereinafter, with reference to the accompanying drawings, various embodiments will be described in detail so that those skilled in the art can easily carry out the present invention.

This invention may be embodied in many different forms, and is not necessarily limited to the embodiments set forth herein.

In order to clearly describe the present invention, parts irrelevant to the description are omitted, and the same reference numerals are assigned to the same or similar components throughout the specification.

While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

Also, when a part such as a layer, film, region, or plate component is said to be "above" or "on" another part, this is not only when it is "directly on" the other part, but also when there is another part in between.

Conversely, when a part is said to be "directly on" another part, it means that there is no other part in between.

In addition, being "above" or "on" a reference part means being located above or below the reference part, and does not necessarily mean being located "above" or "on" it in the opposite direction of gravity.

In addition, throughout the specification, when a certain component is said to "include," it means that it may further include other components without excluding other components unless otherwise stated.

In addition, throughout the specification, when reference is made to a "planar image," it means when the target part is viewed from above, and when reference is made to a "cross-sectional image," it means when a cross-section of the target part cut vertically is viewed from the side. Further, in the entire specification, when it is referred to as "on a plane" or "in a plan view", it means when a target part is viewed from above. Also, throughout the specification, when "connected" is used, this does not mean only the case where two or more components are directly connected, but when two or more components are indirectly connected through another component, physically connected, in the case of being connected or electrically connected, as well as being referred to by different names depending on location or function, each part that is substantially integral may be connected to each other.

In addition, throughout the specification, when a part such as a wire, layer, film, region, plate, component, etc. "extends in a first direction or a second direction," it means only a straight line extending in the corresponding direction. Instead, it is a structure that generally extends along the first direction or the second direction, and it includes a structure that is bent at one part, has a zigzag structure, or extends while including a curved structure.

In addition, electronic devices (e.g., mobile phones, TVs, monitors, notebook computers, etc.) including display devices and display panels described in the specification or display devices and display panels manufactured by the manufacturing method described in the specification are not excluded from the scope of the present specification.

Hereinafter, a head-mounted display device according to an embodiment will be described with reference to FIG. 1.

FIG. 1 is a schematic cross-sectional view of a head-mounted display device according to an embodiment.

A head-mounted display device according to an embodiment includes a display panel 100 (hereinafter also referred to as a display panel of a head-mounted display device) and an optical system 200 positioned in front of the display panel 100.

Here, the optical system 200 is positioned between the display panel 100 and user's eyes 300 to make the light emitted from the display panel 100 appear wider, thereby improving immersion or a three-dimensional effect.

The optical system 200 includes two curved lenses, a first curved lens 210 and a second curved lens 220 (hereinafter referred to as pancake lenses). The curved lenses 210 and 220 each include two optical films 211, 212, 221 and 222.

A detailed look at the optical system 200 is as follows.

The first curved lens 210 (hereinafter referred to as a first pancake lens) is positioned in opposition to a third direction DR3 (also referred to as an inner side) relative to the display panel 100. The first curved lens 210 includes a first retardation plate 211 (hereinafter also referred to as a first optical system retardation plate) and a beam splitter 212. For example, the first retardation plate 211 is placed outside of the first curved lens 210, opposite to the third direction DR3 in relation to the first curved lens 210. The beam splitter 212 is placed outside of the first curved lens 210, facing the third direction DR3 in relation to the first curved lens 210.

The first retardation plate 211 is also referred to as a λ/4 plate and may change linearly polarized light into circularly polarized light or circularly polarized light into linearly polarized light by providing a retardation of λ/4 with respect to a delay axis.

The beam splitter 212 may transmit half of the incident light and reflect the other half regardless of the polarization characteristics of the light.

The second curved lens 220 (also referred to as the second pancake lens) which is located adjacent to the user's eyes 300 includes a second phase difference plate 221 (also referred to as the second optical system phase difference plate) formed on the inside or opposite direction of the third direction DR3, and a reflective polarizing plate 222 (also referred to as the optical system reflective polarizing plate) formed on the outside, which is the third direction DR3 relative to the second curved lens.

The second retardation plate 221 is also referred to as a λ/4 plate and may change linearly polarized light into circularly polarized light or circularly polarized light into linearly polarized light by providing a retardation of λ/4 with respect to the delay axis.

The reflective polarizer 222 includes a reflection axis and reflects linearly polarized light along this axis, while transmitting linearly polarized light perpendicular to the reflection axis.

The reflective polarizer 222 may have a wire grid structure including a plurality of metal lines with fine widths arranged in a direction. The wire grid structure may reflect light parallel to the orientation of the metal lines and transmit light perpendicular to the orientation of the metal lines.

In this case, an interval between the plurality of metal lines may be narrower than the wavelength of visible light.

The first curved lens 210 and the second curved lens 220 included in the optical system 200 may include an optically isotropic material, such as glass or polymethyl methacrylate (PMMA).

In addition, curved surfaces of the first curved lens 210 and the second curved lens 220 may be spherical or aspheric.

Hereinafter, a display panel of a head-mounted display device according to an embodiment will be described with reference to FIG. 2.

Figure 2:
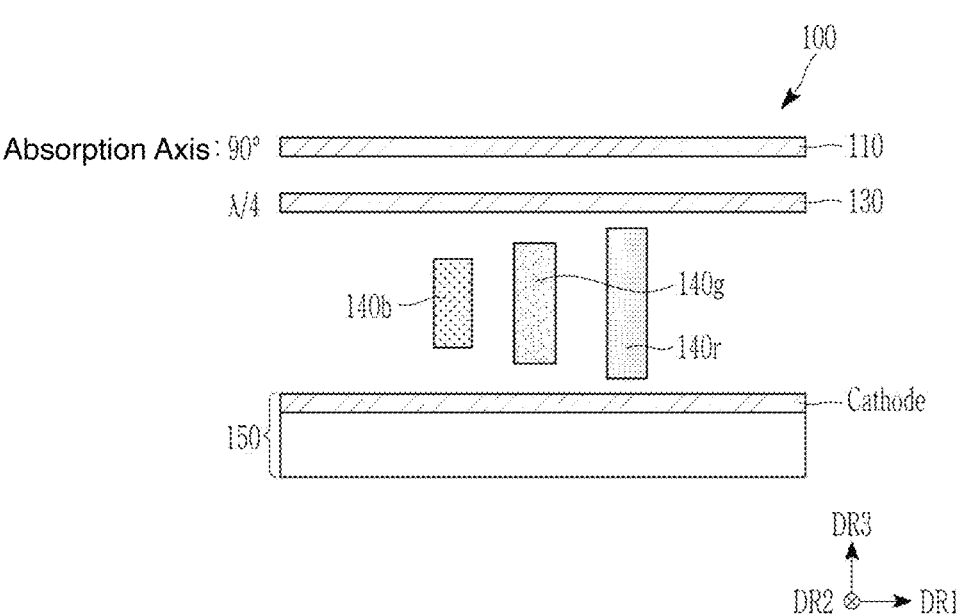
FIG. 2 is a schematic cross-sectional view of a display panel of a head-mounted display device according to an embodiment.

FIG. 2 is a schematic cross-sectional view of a display panel of a head-mounted display device according to an embodiment.

The display panel 100 used in the head-mounted display device according to an embodiment may be a self-emitting display panel that emits light by itself. For example, the self-emitting display panel may include a microLED, an organic light emitting diode OLED, and/or an inorganic light emitting diode LED.

In FIG. 2, a schematic representation of the light emitting device unit 150 included in the display panel 100 is shown. The light emitting device unit (150) may include multiple layers of the display panel 100 where light emitting diodes OLED and the transistors connected to them are formed.

In some embodiments, a color filter (refer to 230r, 230g, and 230b in FIG. 4) or a color conversion layer may be positioned on the front surface (in the third direction DR3) of the light emitting diode OLED.

Only the cathode of the light emitting diode OLED is shown at the top of the light emitting device unit 150 in FIG. 2, and a detailed cross-sectional structure will be described in FIG. 9 and the like.

Cholesteric liquid crystal layers 140r, 140g, 140b (also referred to as a circularly polarized light reflective and transmissive layers) and an absorption-type polarizer 110 (hereinafter also referred to as an absorption type for display panel) are provided on the front surface of the light emitting device unit 150 (in the third direction DR3). Additionally, a type polarizing plate and a retardation plate 130 (hereinafter also referred to as a retardation plate for a display panel) are formed on the front surface of the light emitting device unit 150. For example, the cholesteric liquid crystal layers 140r, 140*g*, and 140*b*, the absorption-type polarizer 110, the type polarizing plate and the retardation plate 130 are all disposed on the light emitting device unit 150 when viewed in the cross-sectional view.

The absorption-type polarizer 110 is located on the outermost side (in the third direction DR3) of the light emitting device unit 150, with the retardation plate 130 disposed inside the absorption-type polarizer 110, followed by the cholesteric liquid crystal layers 140*r*, 140*g*, and 140*b*.

The absorption-type polarizer 110 includes an absorption axis. The absorption type polarizer 110 may absorb linearly polarized light along the absorption axis and may transmit linearly polarized light that is perpendicular to the absorption axis.

Here, the direction perpendicular to the absorption axis corresponds to the transmission axis.

In the embodiment of FIG. 2, the absorption axis of the absorption-type polarizer 110 may be disposed at a 90-degree angle, and the absorption-type polarizer 110 may have a film form including tri-acetyl cellulose (TAC).

The retardation plate 130 is also referred to as a λ/4 plate and may change linearly polarized light into circularly polarized light or circularly polarized light into linearly polarized light by providing a retardation of λ/4 with respect to a delay axis.

Here, the retardation axis of the retardation plate 130 may have a 45-degree angle relative to either the absorption axis or the transmission axis of the absorption-type polarizer 110.

The cholesteric liquid crystal layers 140*r*, 140*g*, and 140*b* may be formed by coating chiral liquid crystal molecules with a twisted structure. Additionally, the cholesteric liquid crystal layers 140*r*, 140*g*, and 140*b* may be formed by coating the inner surface of the retardation plate 130 or the light emitting device unit 150, or on the top surface.

The cholesteric liquid crystal layers 140*r*, 140*g*, and 140*b* have a pitch value based on the degree of twist of the liquid crystal molecules. The cholesteric liquid crystal layers 140*r*, 140*g*, and 140*b* may modulate the transmission of light based on the pitch value and may adjust the wavelength of the light, either allowing it to be transmitted or reflected.

That is, the cholesteric liquid crystal layers 140*r*, 140*g*, and 140*b* may transmit circularly polarized light in one direction and reflect circularly polarized light in the opposite direction for light with a wavelength λ as defined by Equation 1 provided below.

$$\text{wavelength } (\lambda) = n \times \text{pitch value} \qquad \text{[equation 1]}$$

Here, the wavelength λ represents the wavelength of light either reflected or transmitted by the cholesteric liquid crystal layers 140*r*, 140*g*, and 140*b*. A variable n represents a refractive index value, and the pitch value of the corresponding cholesteric liquid crystal layers 140*r*, 140*g*, and 140*b* represents the pitch value of the liquid crystal molecules.

In Equation 1, the refractive index value n may be the average refractive index value of the corresponding cholesteric liquid crystal layers 140*r*, 140*g*, and 140*b*.

The cholesteric liquid crystal layers 140*r*, 140*g*, and 140*b* include a first color cholesteric liquid crystal layer 140*r* (hereinafter referred to as a first cholesteric liquid crystal layer), a second color cholesteric liquid crystal layer 140*g* (hereinafter referred to as a second cholesteric liquid crystal layer), and a cholesteric liquid crystal layer for a third color 140*b* (hereinafter referred to as a third cholesteric liquid crystal layer).

The first color cholesteric liquid crystal layer 140*r* may transmit circularly polarized light in one direction and reflect circularly polarized light in the opposite direction for light with a wavelength range corresponding to the first color.

For example, the first color may be red, one of the three primary colors of light, and the wavelength value of Equation 1 of the first color cholesteric liquid crystal layer 140*r* may have a wavelength of 600 nm to 700 nm corresponding to the first color.

The cholesteric liquid crystal layer 140*g* for the second color may transmit circularly polarized light in one direction and reflect circularly polarized light in the opposite direction for light with a wavelength range corresponding to the second color.

For example, the second color may be green, one of the three primary colors of light, and the wavelength value of Equation 1 of the second color cholesteric liquid crystal layer 140*g* may have a wavelength of 500 nm or more and less than 600 nm corresponding to the second color.

The cholesteric liquid crystal layer 140*b* for the third color may transmit circularly polarized light in one direction and reflect circularly polarized light in the opposite direction for light with a wavelength range corresponding to the third color.

For example, the third color may be blue, one of the three primary colors of light, and the wavelength value of Equation 1 of the third color cholesteric liquid crystal layer 140*b* may have a wavelength of 400 nm or more and less than 500 nm corresponding to the third color.

Figure 3:
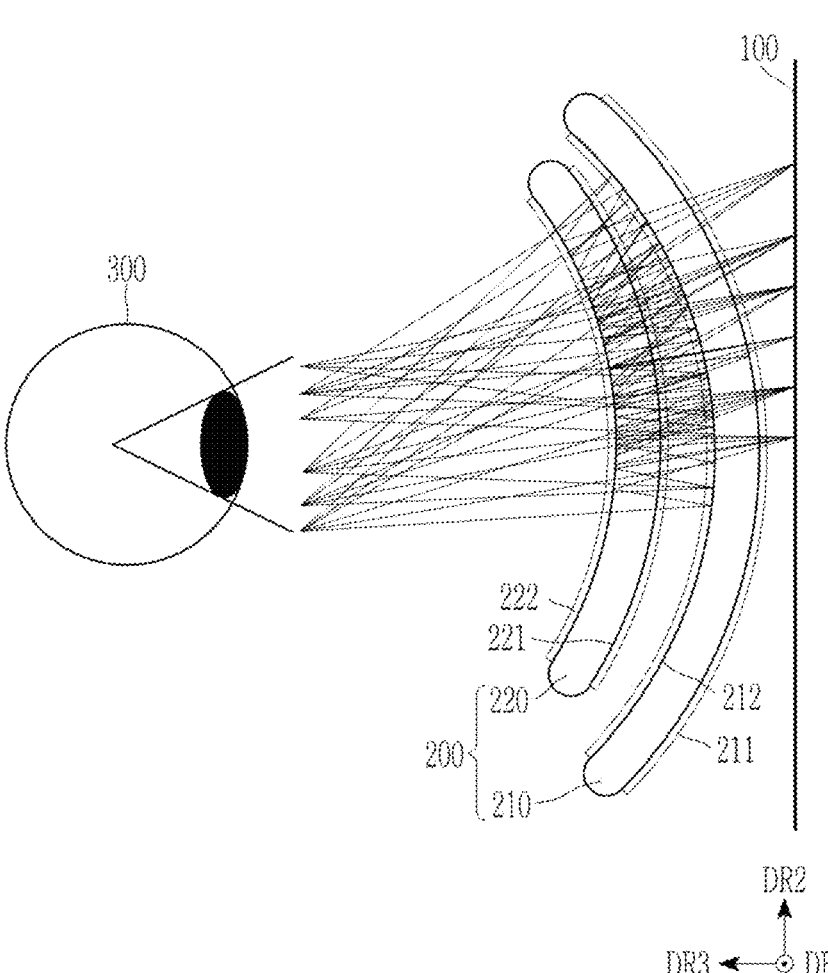
FIG. 3 is a diagram illustrating a schematic optical path of a head-mounted display device according to an embodiment.

An optical path in the head-mounted display device having the above structure may be as shown in FIG. 3.

FIG. 3 is a diagram illustrating a schematic optical path of a head-mounted display device according to an embodiment.

FIG. 3 schematically illustrates an optical path through which light emitted from the display panel 100 of a head-mounted display device passes through the optical system 200 and is transmitted to the user's eyes 300.

Light emitted from the display panel 100 of a head-mounted display device may pass through both the first curved lens 210 and the second curved lens 220, before reaching the user's eyes 300.

In addition, after being reflected from the reflective polarizing plate 222 of the second curved lens 220 then from the beam splitter 212 of the first curved lens 210, the light emitted from the display panel 100 may reach the user's eyes 300, with multiple reflections from the reflective polarizing plate 222 and the beam splitter 212 occurring before reaching the user's eyes 300.

Referring to FIG. 3, because the user's eyes 300 may recognize the light bent by the first curved lens 210 and the second curved lens 220, the size of the display panel 100 of the head-mounted display device may be larger than that of the display panel 100.

Consequently, the users may experience a heightened level of immersion in the image, enhancing the perceived three-dimensional display effect during the display.

In addition, when the two curved lenses 210 and 220 are used as shown in FIG. 3, the light path becomes longer. Consequently, the users may perceive the image as if it is being presented from a greater distance even with a thin-head mounted display device.

Light characteristics and transmittance of the head-mounted display device according to the embodiment will be described in detail with reference to FIG. 4.

Figure 4:
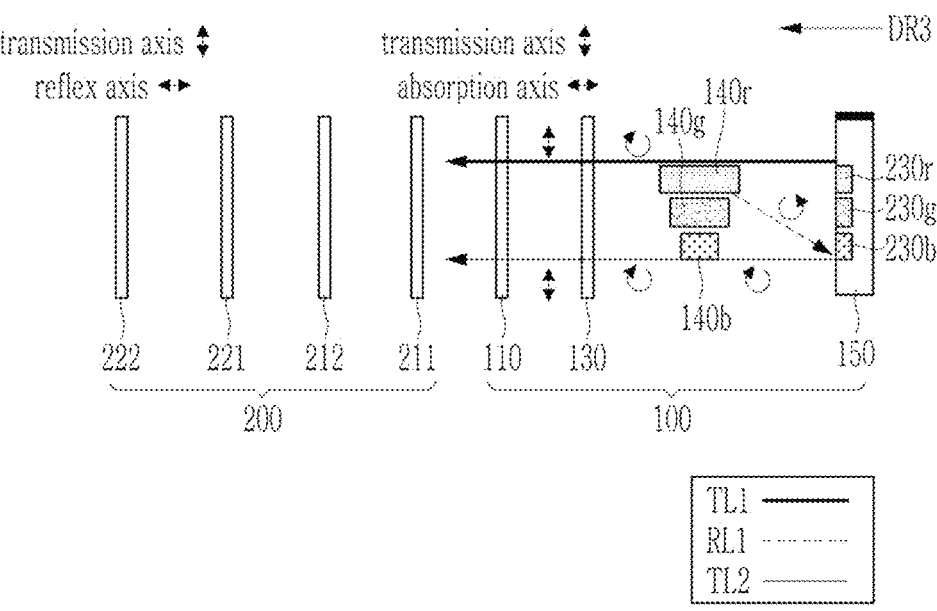
FIG. 4 is a diagram schematically illustrating an optical path of a head-mounted display device according to an embodiment.

FIG. 4 is a diagram schematically illustrating an optical path of a head-mounted display device according to an embodiment.

The optical system 200 has a curved surface.

In FIG. 4, the transmittance, path, and polarization characteristics of light in the display panel 100 of the head-mounted display are as follows.

Referring to FIG. 4, in the display panel 100 of the head-mounted display device, only the color filters 230r, 230g, and 230b are shown on the uppermost side of the light emitting device unit 150, and the color filters 230r, 230g, and 230b, the cholesteric liquid crystal layers 140r, 140g, and 140b, the retardation plate 130, and the absorption-type polarizer 110 are sequentially positioned on the upper side in the third direction DR3. For example, the absorption-type polarizer 110 may be disposed furthest away from the light emitting device unit 150. Additionally, the cholesteric liquid crystal layers 140r, 140g, and 140b are disposed between the retardation plate 130 and the light emitting device unit 150.

In an embodiment, the absorption-type polarizer 110 is arranged at a 90-degrees angle to the absorption axis, and the transmission axis is arranged at a 0-degrees angle. The delay axis of the retardation plate 130 may be arranged at a 45-degrees angle to the absorption axis or the transmission axis of the absorption-type polarizer 110.

The light emitting device unit 150 may further include a light emitting diode OLED, which is disposed below the color filters 230r, 230g, and 230b, and emits a light corresponding to each of the color filters 230r, 230g, and 230b.

For example, the light emitted from the light emitting diode OLED may display white color, and may display a color corresponding to one of the three primary colors of light as it passes through the respective color filters 230r, 230g, and 230b.

The red color filter 230r (hereinafter referred to as a first color filter) may be positioned to overlap the first color cholesteric liquid crystal layer 140r on a plane, and the green color filter 230g (hereinafter referred to as a second color filter) may be positioned to overlap the cholesteric liquid crystal layer 140g for the second color on a plane, and the blue color filter 230b (hereinafter referred to as a third color filter) is the cholesteric liquid crystal layer 140b for the third color, and may be positioned to overlap the cholesteric liquid crystal layer 140b for the third color on a plane.

Referring to FIG. 4, the red color filter 230r, the green color filter 230g, and the blue color filter 230b are used, but colors are not necessarily limited thereto. For example, other three primary colors of light may be used.

In some embodiments, a color conversion layer may be included instead of the color filters 230r, 230g, and 230b. The color conversion layer may change light of a specific wavelength into light of a wavelength corresponding to one of the three primary colors of light.

In some embodiments, the light emitting device unit 150 may not include separate color filters 230r, 230g, and 230b or a color conversion layer. Instead, each light emitting diode OLED may emit light corresponding to three primary colors of light.

In some embodiments, a light blocking layer (refer to BM of FIG. 9) may be positioned between any two of the color filters, which include the red color filter 230r, the green color filter 230g, and the blue color filter 230b.

The light emitting diode OLED may include an anode, a light emitting layer, and a cathode. According to embodiments, the cathode of the light emitting diode may be formed to have a transflective property, transmitting 50% of the light and reflecting the remaining 50% of the light. But reflectance of the cathode is not necessarily limited thereto, and the percentage of reflected light may vary.

On the other hand, the anode of the light emitting diode OLED has a reflective property and can reflect all incident light.

Light emitted from the light emitting diode OLED of the light emitting device unit 150 passes through the color filters 230r, 230g, and 230b and is provided to the cholesteric liquid crystal layers 140r, 140g, and 140b.

Light of each color transmitted through the color filters 230r, 230g, and 230b is incident on the cholesteric liquid crystal layers 140r, 140g, and 140b corresponding to each color.

The wavelengths of light that are either transmitted TL1 and TL2 or reflected RL1 by the cholesteric liquid crystal layers 140r, 140g, and 140b correspond with the wavelengths of light passing through the color filters 230r, 230g, and 2340b. Thus, light transmitted TL1 which is circularly polarized light in a specific direction, is transmitted through the cholesteric liquid crystal layers 140r, 140g, and 140b, while light reflected RL1 which is opposite circularly polarized light (hereinafter referred to as the second circularly polarized light) is reflected.

The light transmitted TL1 and light reflected RL1 through the cholesteric liquid crystal layers 140r, 140g, and 140b may account for 50% of total light.

The reflected circularly polarized light is reflected from either the cathode or anode of the light emitting diode OLED and is provided in the third direction DR3. Then the light which changed to the first circularly polarized light due to the reflection passes through the cholesteric liquid crystal layers 140r, 140g, and 140b. Re-transmission TL2 allows utilization of more than 50% of the total light, enhancing light efficiency.

For example, in the embodiment of FIG. 4, red light transmitted TL1 with circular polarization in the clockwise direction passes through the first color cholesteric liquid crystal layer 140r. Then the light is reflected RL1 with opposite circular polarization—that is, the counter-clockwise direction.

The light reflected RL1 in counterclockwise direction is reflected from the cathode or anode in the third direction (DR3). For example, the light reflected RL1 moves away from the light emitting device unit 150. Then, the light, changed to the clockwise circularly polarized light due to reflection, passes through the first color cholesteric liquid crystal layer 140r and is re-transmitted TL2.

In the embodiment FIG. 4, green light transmitted TL1 with circular polarization in the clockwise direction passes through the second color cholesteric liquid crystal layer 140g. Then the light is reflected RL1 with opposite circular polarization—that is, the counter-clockwise direction.

The light reflected RL1 in counterclockwise direction is reflected from the cathode or anode in the third direction (DR3). Then, the light, changed to the clockwise circularly polarized light due to the reflection, passes through the second color cholesteric liquid crystal layer 140r and is re-transmitted TL2.

In the embodiment of FIG. 4, blue light transmitted TL1 with circular polarization in the clockwise direction passes through the third color cholesteric liquid crystal layer 140b. Then the light is reflected RL1 with opposite circular polarization—that is, the counter-clockwise direction.

The light reflected RL1 in counterclockwise direction is reflected from the cathode or anode in the third direction (DR3). Then, the light, changed to the clockwise circularly polarized light due to the reflection, passes through the third color cholesteric liquid crystal layer 140b and is re-transmitted TL2.

As described above, the counterclockwise circularly polarized light is transmitted and re-transmitted TL1 and TL2 for each color through the cholesteric liquid crystal layers 140r, 140g, and 140b to the retardation plate 130.

Since the retardation plate 130 provides a retardation of λ/4 along the delay axis, it may change counterclockwise circularly polarized light into 0 degrees linearly polarized light.

The linearly polarized light thus changed is incident to the absorption-type polarizer 110. But it is transmitted to the optical system 200 from the display panel 100 of a head-mounted display device. The transmission aligns with the absorption-type polarizer's 110 transmission axis.

In the optical system 200 of the head-mounted display device of FIG. 4, the reflection axis of the reflective polarizer 222 may be set at a 90-degree angle in relation to the reflective polarizer 222 and the transmission axis of the reflective polarizer 222 may be set at 0-degree angle in relation to the reflective polarizer 222. For example, the transmission axis of the reflective polarizer 222 may be parallel to the reflective polarizer 222.

Delay axes of the first retardation plate 211 and the second retardation plate 221 may be disposed at 45-degrees angle with respect to the reflection axis of the reflective polarizing plate 222 and the absorption axis of the absorbing polarizing plate 110

The linearly polarized light at 0 degrees which is transmitted to the optical system 200 changes to circularly polarized light as it passes through the first retardation plate 211. Subsequently, it is transmitted to the beam splitter 212.

The beam splitter 212 transmits half of the incident light and reflects the remaining half downward.

Light reflected by the beam splitter 212 may be transmitted to and absorbed by the absorption-type polarizer 110.

Circularly polarized light transmitted through the beam splitter 212 may be changed to linearly polarized light at 90 degrees as it passes through the second retardation plate 221. Subsequently, it is reflected in alignment with the reflection axis of the reflective polarizer 222.

The light reflected from the reflective polarizer 222 is changed to circularly polarized light as it passes through the second retardation plate 221. It is reflected again by the beam splitter 212 and proceeds in the third direction DR3 towards the second retardation plate 221. Subsequently, the light changes to linearly polarized light at 0 degrees and may be transmitted through the reflective polarizer 222.

The trajectory discussed above removes the necessity for the user's eyes to be positioned far from the optical system 200. Thus, the thickness of the head-mounted device may be minimized, providing the user's eyes with a broader and more extensive view of the image.

In general, a head mounted display including a polarizer has reduced light efficiency due to the absorption-type polarizer 110. However, cholesteric liquid crystal layers 140r, 140g, and 140b which reflects the circularly polarized light in one direction increases the recycled amount of light transmitted from the display panel 100 of the head-mounted display device to the optical system 200.

Hereinafter, differences from the embodiment of FIG. 4 will be compared and reviewed through the comparative example of FIG. 5.

Figure 5:
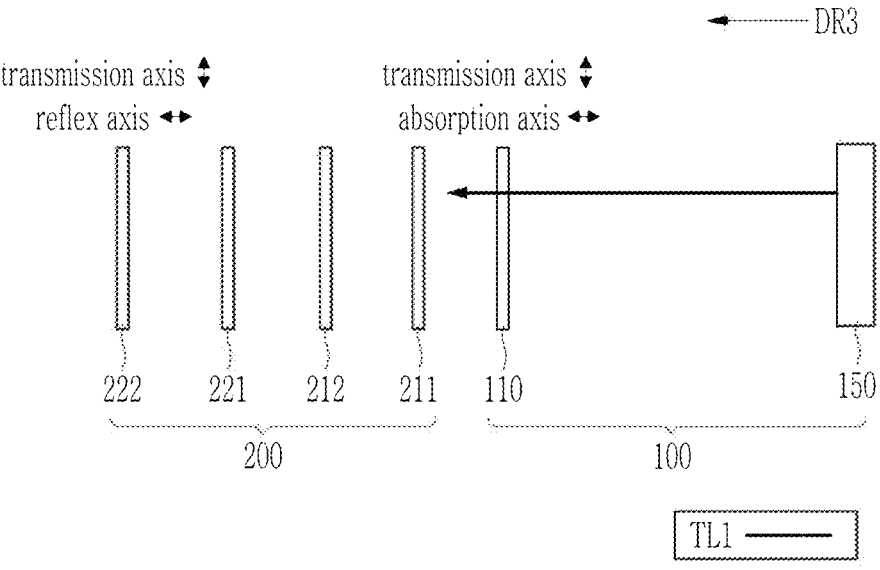
FIG. 5 is a diagram schematically illustrating an optical path of a head-mounted display device according to a comparative example.

FIG. 5 is a diagram schematically illustrating an optical path of a head-mounted display device according to a comparative example.

The comparative example of FIG. 5 has the same structure as the embodiment of FIG. 4, but the display panel 100 of the head-mounted display device only includes the absorption-type polarizer 110 and does not include the cholesteric liquid crystal layer 140r, 140g, and 140b and the retardation plate 130.

Therefore, the path of light in the optical system 200 in the comparative example of FIG. 5 may not be different from that of the example of FIG. 4.

In FIG. 5, the light transmitted from the display panel 100 of the head-mounted display device to the optical system 200 is linearly polarized light aligned with the transmission axis of the absorption-type polarizer 110. Unlike the embodiment of FIG. 4, only light TL1 is transmitted.

That is, since the absorption-type polarizer 110 transmits 50% of the total light and absorbs the remaining 50%, the amount of light transmitted to the optical system 200 cannot exceed 50% of the total light.

In comparison, in the embodiment of FIG. 4, 50% of the light reflected RL1 from the cholesteric liquid crystal layers 140r, 140g, and 140g is re-reflected and the cholesteric liquid crystal layers 140r, 140g, and 140b may transmit TL2 the light, allowing for the potential utilization of up to 100% of the light.

Hereinafter, some of the modified structures of the embodiment of FIG. 4 will be examined in detail.

Figure 6:
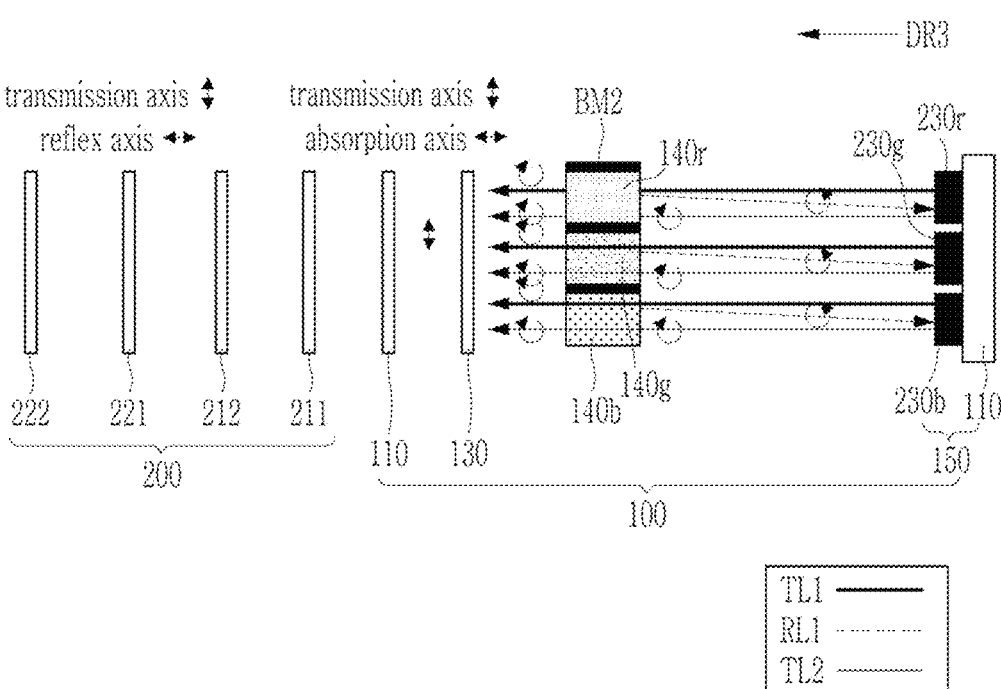
FIG. 6 to FIG. 8 are views schematically illustrating an optical path of a head-mounted display device according to an embodiment.
Figure 7:
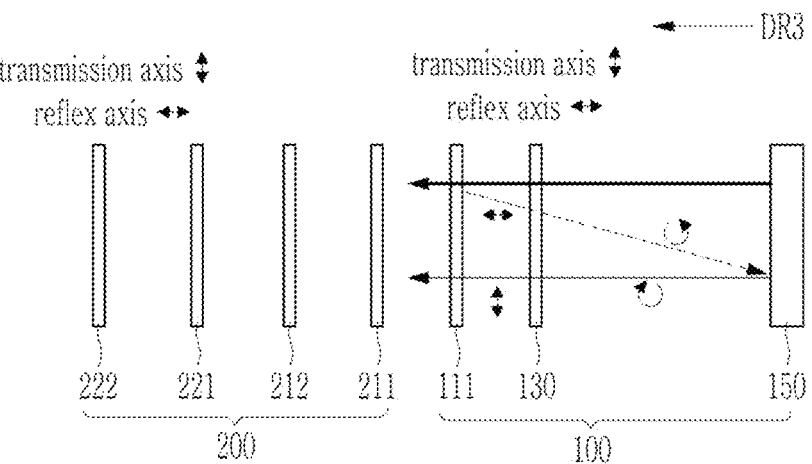
Figure 8:
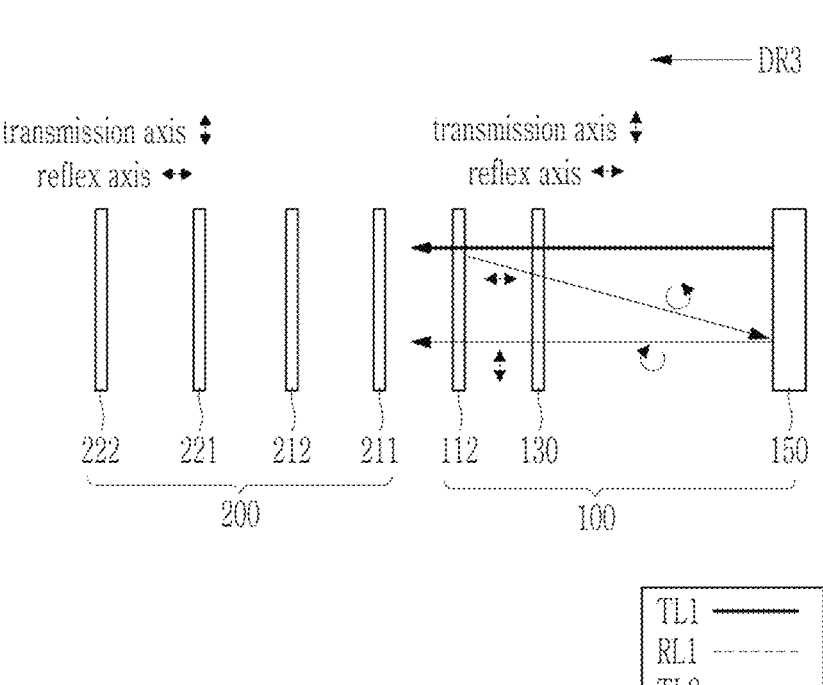

FIG. 6 to FIG. 8 are views schematically illustrating an optical path of a head-mounted display device according to another embodiment.

In FIG. 6, a modified structure of the display panel 100 of a head-mounted display including the cholesteric liquid crystal layers 140r, 140g, and 140b as in the embodiment of FIG. 4 will be described.

FIG. 6 further includes an upper light blocking layer BM2 capable of blocking light interference among the cholesteric liquid crystal layers 140r, 140g, and 140b.

Each of the cholesteric liquid crystal layers 140r, 140g, and 140b has a wavelength for reflection and transmission based on Equation 1. Consequently, when light of a different color is applied, the light disappears without being transmitted or reflected, diminishing the light efficiency.

To prevent this, the embodiment of FIG. 6 further includes the upper light blocking layer BM2 between the cholesteric liquid crystal layers 140r, 140g, and 140b.

The display panel 100 of a head-mounted display device includes a light emitting device unit 150 and cholesteric liquid crystal layers 140r, 140g, and 140b positioned on the front surface of the light emitting device unit 150.

The upper light blocking layer BM2 positioned between two of the cholesteric liquid crystal layers 140r, 140g, and 140b, a retardation plate 130 positioned in front of the cholesteric liquid crystal layers 140r, 140g, and 140b, the upper light blocking layer BM2, and the absorption-type polarizer 110 positioned on the front surface of the retardation plate 130, and the cholesteric liquid crystal layers 140r, 140g, and 140b each have different wavelength values according to the Equation 1 above.

The first color cholesteric liquid crystal layer 140r may transmit circularly polarized light in one direction and reflect circularly polarized light in the opposite direction in a wavelength range corresponding to the first color.

For example, the first color may be red, which is one of the three primary colors of light. The wavelength value of Equation 1 of the first color cholesteric liquid crystal layer 140r is a wavelength band corresponding to the first color is 600 nm or more and 700 nm or less.

The second color cholesteric liquid crystal layer 140g may transmit circularly polarized light in one direction and reflect circularly polarized light in the opposite direction in a wavelength range corresponding to the second color.

For example, the second color may be green, which is one of the three primary colors of light. The wavelength value of Equation 1 of the second color cholesteric liquid crystal layer 140*g* is a wavelength band corresponding to the second color, and is 500 nm or more and less than 600 nm.

The third cholesteric liquid crystal layer 140*b* transmit circularly polarized light in one direction and reflect circularly polarized light in the opposite direction in a wavelength range corresponding to the third color.

For example, the third color may be blue, which is one of the three primary colors of light. The wavelength value of Equation 1 of the third color cholesteric liquid crystal layer 140*b* is a wavelength band corresponding to the third color and is 400 nm or more and less than 500 nm.

In the display panel 100 of a head-mounted display device according to the embodiment of FIG. 6, the upper light blocking layer BM2 is positioned between the cholesteric liquid crystal layers 140*r*, 140*g*, and 140*b*. For example, the upper light blocking layer BM2 covers the red color filter 230*r* so that the light passing through is transmitted only to the first color cholesteric liquid crystal layer 140*r*. The upper light blocking layer BM2 covering the green color filter 230*g* allows the light passing through the green color filter 230*g* is transmitted only to the second color cholesteric liquid crystal layer 140*g*. The upper light blocking layer BM2 covering the blue color filter 230*g* allows the blue color filter light passing through 230*b* is transmitted only to the third color cholesteric liquid crystal layer 140*b*.

As a result, in the embodiment of FIG. 6, the clockwise circularly polarized light is transmitted TL1 through the first color cholesteric liquid crystal layer 140*r* and the circularly polarized light in the opposite direction—that is, counter-clockwise—is re-transmitted RL1.

The light reflected RL1 in counterclockwise direction is reflected from the cathode or anode in the third direction (DR3). Then, the light, changed to the clockwise circularly polarized light due to the reflection, passes through the first color cholesteric liquid crystal layer 140*r* and is re-transmitted TL2.

In the embodiment of FIG. 6, green light transmitted TL1 with circular polarization in the clockwise direction passes through the second color cholesteric liquid crystal layer 140*b*. Then the light is reflected RL1 with opposite circular polarization—that is, the counter-clockwise direction.

The light reflected RL1 in counterclockwise direction is reflected from the cathode or anode in the third direction (DR3). Then, the light, changed to the clockwise circularly polarized light due to the reflection, passes through the second color cholesteric liquid crystal layer 140*r* and is re-transmitted TL2.

In the embodiment of FIG. 6, blue light transmitted TL1 with circular polarization in the clockwise direction passes through the third color cholesteric liquid crystal layer 140*b*. Then the light is reflected RL1 with opposite circular polarization—that is, the counter-clockwise direction.

The light reflected RL1 in counterclockwise direction is reflected from the cathode or anode in the third direction (DR3). Then, the light, changed to the clockwise circularly polarized light due to the reflection, passes through the third color cholesteric liquid crystal layer 140*b* and is re-transmitted TL2, thereby improving the light efficiency.

Compared to the embodiment of FIG. 4, the embodiment of FIG. 6 has an advantage of maintaining the light efficiency because a light of a specific color will reach only the corresponding cholesteric liquid crystal layers 140*r*, 140*g*, and 140*b*.

In some embodiments, the display panel 100 of a head-mounted display device may not include the cholesteric liquid crystal layers 140*r*, 140*g*, and 140*b*, which will be described through FIG. 7 and FIG. 8.

The display panel 100 of the head-mounted display device in FIG. 7 and FIG. 8 does not include the absorption-type polarizer 110. Instead, an embodiment includes a reflective polarizer (also referred to as a reflective polarizer for a display device) that reflects some of the linearly polarized light and transmits some of it.

FIG. 7 illustrates an embodiment in which a luminance enhancement film 111 (e.g., double brightness enhancement film (DBEF)) is used as a reflective polarizer, and in FIG. 8, a wire grid is arranged in one direction as a reflective polarizer 112.

Referring to FIG. 7, the luminance enhancement film 111 includes two layers with different refractive indices stacked repeatedly. At the boundary of the two layers, some light is reflected due to difference in refractive index. However, multiple of boundaries results in reflecting all light in a specific direction, while transmitting light which is perpendicular to this direction.

Referring to FIG. 8, the wire grid reflective polarizer 112 includes a plurality of metal lines having fine widths arranged in one direction. The wire grid reflective polarizer 112 may reflect light parallel to the arrangement direction of the metal lines and transmit light perpendicular thereto.

The interval between the plurality of metal lines of the wire grid reflective polarizer 112 may be narrower than the wavelength of visible light.

The reflection axes of the luminance enhancement film 111 and wire grid reflective polarizer 112 may have the same angle as the reflection axis of the reflective polarizer 222.

In the embodiments of FIG. 7 and FIG. 8, the retardation plate 130 and the light emitting device unit 150 may be positioned under the luminance enhancement film 111 and the wire grid reflective polarizer 112. The word under used here may mean that the retardation plate 130 is positioned on the side opposite to DR3 direction.

Figure 11:
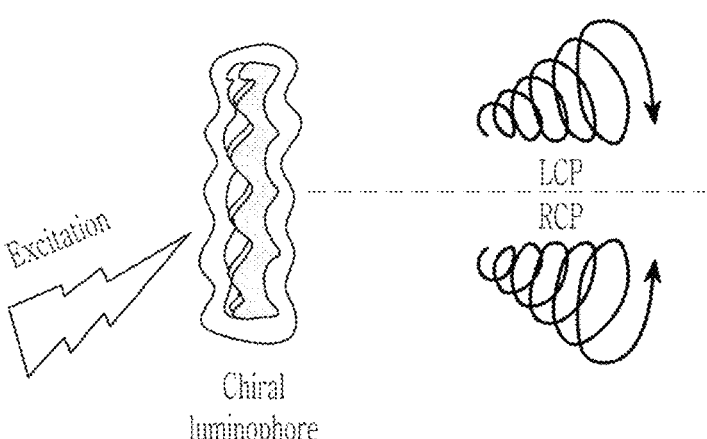
FIG. 11 and FIG. 12 are diagrams showing details of an example of a light emitting layer in a display panel of a head-mounted display device according to an embodiment.
Figure 12:
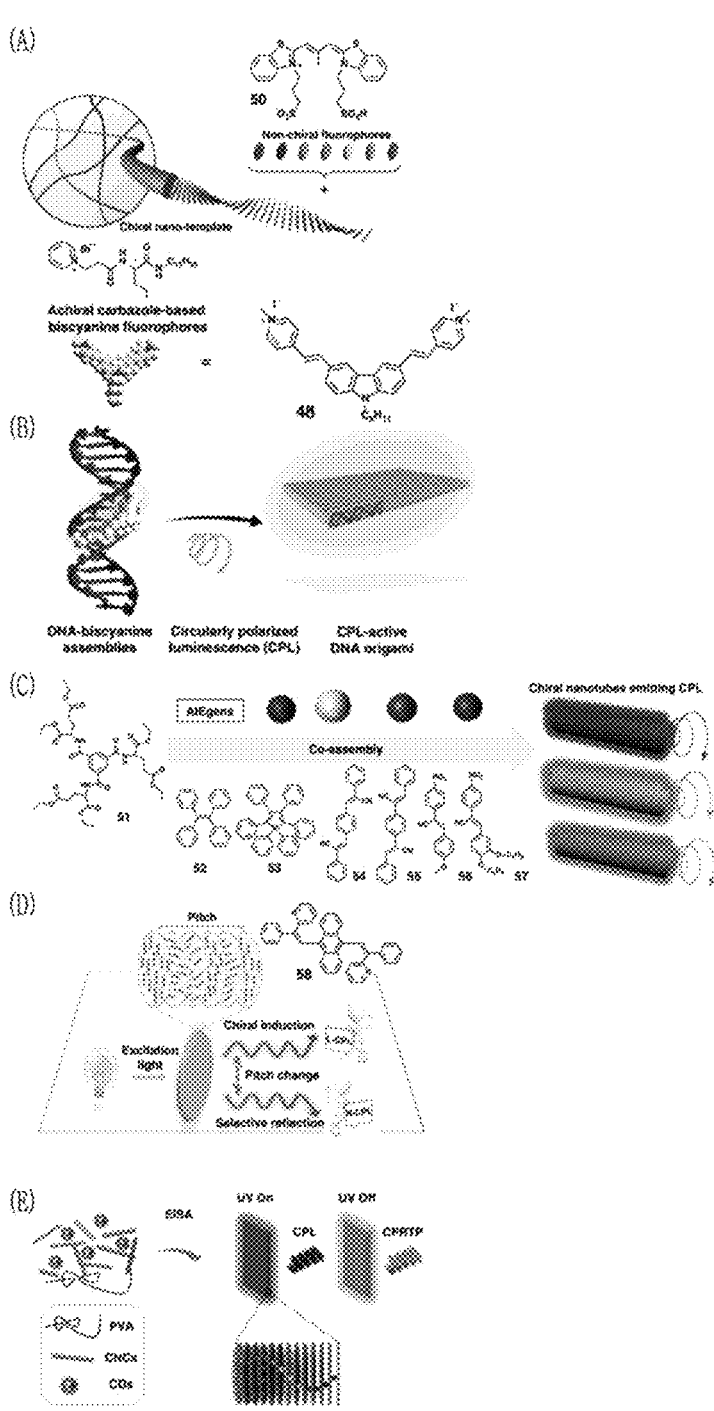

Here, the light emitting device unit 150 may emit circularly polarized light from the light emitting diode OLED. The light emitting layer of the light emitting diode OLED may be as shown in FIG. 11 and FIG. 12.

This will be described later with reference to FIG. 11 and FIG. 12.

Circularly polarized light emitted from the light emitting device unit 150 passes through the retardation plate 130 and is changed into linearly polarized light. When the changed linearly polarized light aligns with the transmission axis of the reflective polarizers 111 and 112, it is transmitted.

Meanwhile, when the linearly polarized light aligns with the reflection axis of the luminance enhancement film 111 and the wire grid reflective polarizer 112, it is reflected and then changed to circularly polarized light again at the retardation plate 130 and reflected in the third direction DR3 at the cathode or anode.

As the light is converted into linearly polarized light in the retardation plate 130, the light aligns with the transmission axis of the luminance enhancement film 111 and the wire grid reflective polarizer 112 and is transmitted.

Consequently, the amount of light used in the head-mounted display device increases, thereby increasing light efficiency.

In the above, the structure of the light emitting device unit 150 of the display panel 100 of a head-mounted display device has been schematically reviewed.

Hereinafter, a detailed cross-sectional structure of the light emitting device unit 150 of the display panel 100 of a head-mounted display device will be described in detail through FIG. 9 and FIG. 10.

Figure 9:
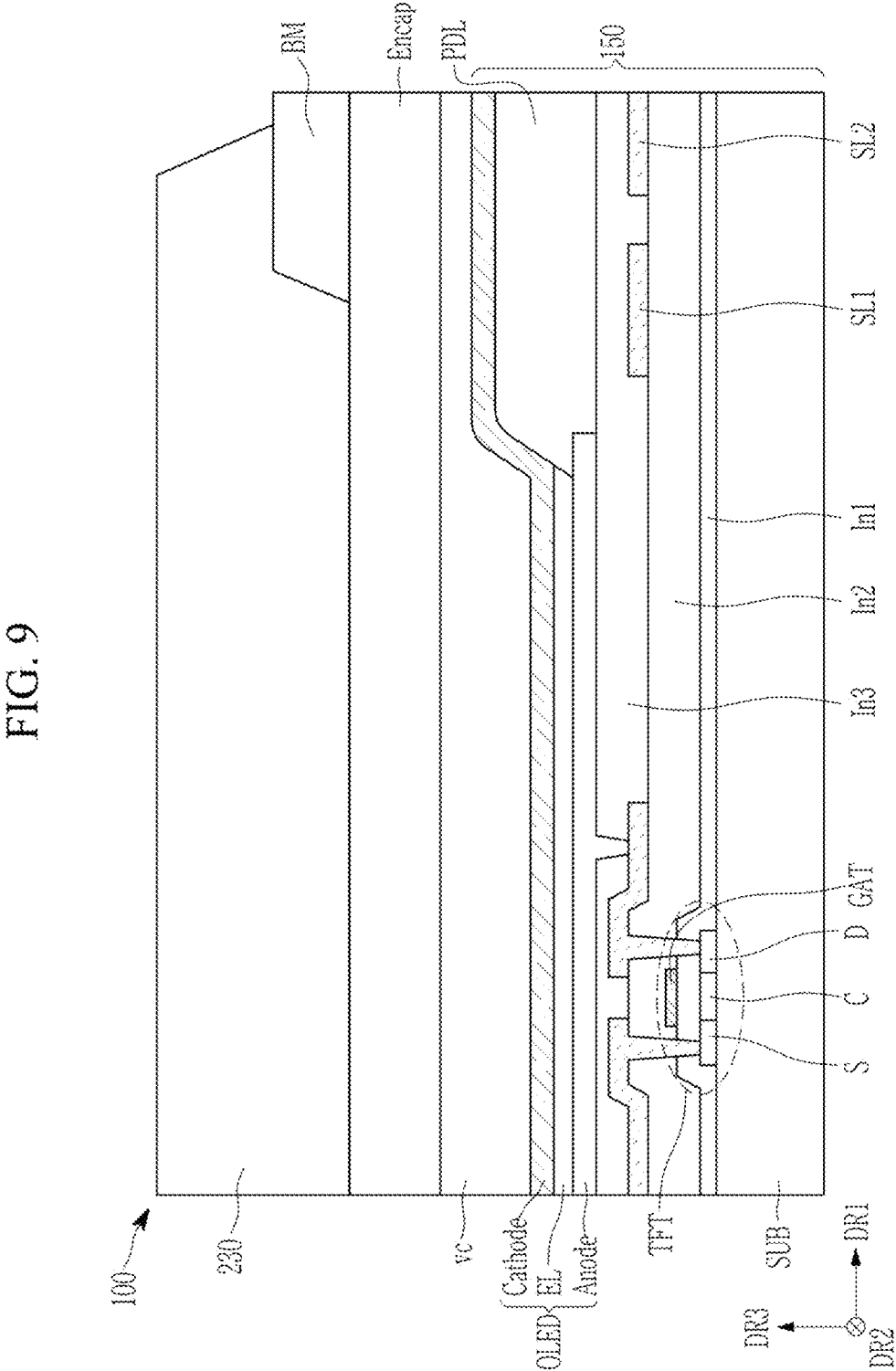
FIG. 9 and FIG. 10 are schematic cross-sectional views of a display panel of a head-mounted display device according to various embodiments.
Figure 10:
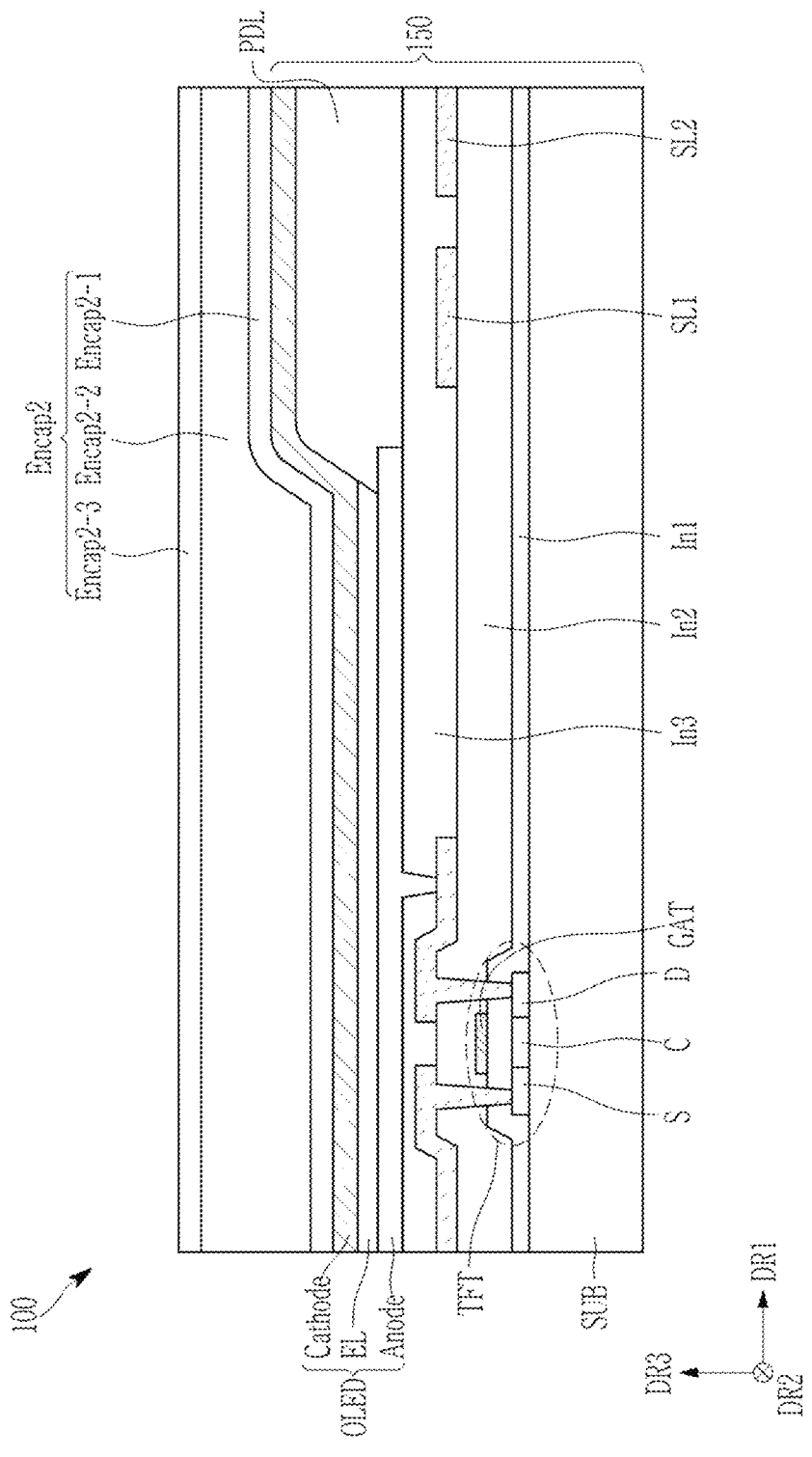

In FIG. 9 and FIG. 10, the cholesteric liquid crystal layers 140r, 140g, and 140b positioned above the light emitting device unit 150 of the display panel 100 used in the head-mounted display device, the absorption-type polarizer 110, the retardation plate 130, the upper light blocking layer BM2, and/or the luminance enhancement film 111 and the wire grid reflective polarizer 112 are omitted, and may be additionally attached according to each embodiment.

FIG. 9 and FIG. 10 are schematic cross-sectional views of a display panel of a head-mounted display device according to various embodiments.

First, the structure of the display panel 100 of a head-mounted display device according to an embodiment will be described through FIG. 9.

The display panel 100 used in the head-mounted display device according to the embodiment of FIG. 9 illustrates an organic light emitting display panel including an organic light emitting diode OLED.

The organic light emitting diode OLED may include an encapsulation substrate Encap1, the color filter 230, and the light blocking layer BM.

The organic light emitting display panel further includes a substrate SUB. The substrate SUB includes an inorganic insulating material, such as glass, or an organic insulating material, such as plastic or polyimide (PI). In some embodiments, the substrate SUB may include a silicon substrate.

The substrate SUB may include at least one base layer, including a polymer resin, and at least one inorganic layer. The base layer and the inorganic layer are sequentially and alternately stacked.

The substrate SUB may have various degrees of flexibility.

The substrate SUB may be a rigid substrate or a flexible substrate capable of being bent, folded, or rolled.

A semiconductor layer is positioned on the substrate SUB.

The semiconductor layer may include a polycrystalline silicon or an oxide semiconductor.

The semiconductor layer includes a channel region C, a first region S, and a second region D.

The first region S and the second region D are disposed on both sides of the channel region C For example, the channel region C is disposed between the first region S and the second region D and is in direct contact with the first region S and the second region D. The channel region C, the first region S, and the second region D are aligned at the same level.

The channel region C is a semiconductor region doped with a fewer or no impurities compared to the first region S and the second region D. The first region S and the second region D are semiconductor regions doped with a higher amount of impurities compared to the channel region C.

A first inorganic insulating layer In1 is positioned on the semiconductor layer.

The first inorganic insulating layer In1 may have a single-layer or multi-layer structure including silicon oxide (SiO$_x$), silicon nitride (SiN$_x$), and/or silicon oxynitride (SiO$_x$N$_y$).

A first gate conductive layer including a gate electrode GAT is positioned on the first inorganic insulating layer In1.

The first gate conductive layer may be a single layer including a laminated metal film which includes copper (Cu), copper alloy, aluminum (Al), aluminum alloy, molybdenum (Mo), molybdenum alloy, titanium (Ti), and/or titanium alloy. In some embodiments, the first gate conductive layer may be a multilayer film.

The gate electrode GAT may overlap the channel region C of the planar semiconductor layer. For example, the gate electrode GAT may be disposed on the channel region C.

The semiconductor layer including the channel region C, the first region S, and the second region D, and the gate electrode GAT overlapping the channel region C may constitute a transistor TFT.

A second inorganic insulating layer In2 is positioned on the first gate conductive layer and the first inorganic insulating layer In1.

The second inorganic insulating layer In2 may be a single layer or a multi-layer including silicon oxide (SiO$_x$), silicon nitride (SiN$_x$), and/or silicon oxynitride (SiO$_x$N$_y$).

The first data conduction including electrodes (source electrode and drain electrode) is connected to the first region S and the second region D of the semiconductor layer and the signal lines SL1 and SL2 on the second inorganic insulating layer In2.

The source electrode and the drain electrode may be electrically connected to the first region S and the second region D of the semiconductor layer, respectively, through contact holes formed in the second inorganic insulating layer In2.

In some embodiments, the semiconductor layer may be directly extended and electrically connected to an adjacent pixel without a source electrode and a drain electrode.

The first data conductive layer includes aluminum (Al), silver (Ag), magnesium (Mg), gold (Au), nickel (Ni), chromium (Cr), calcium (Ca), molybdenum (Mo), titanium (Ti), tungsten (W), and/or copper (Cu), or the like, and may include a single layer or multi-layer structure including the same.

In some embodiments, a second gate conductive layer and an additional inorganic insulating layer may be further included on the second inorganic insulating layer In2 and between the first data conductive layers.

The second gate conductive layer may include a storage electrode overlapping the gate electrode of the first gate conductive layer and form a storage capacitor.

The additional inorganic insulating layer covers the second gate conductive layer and insulates the gate conductive layer from the first data conductive layer.

A first organic insulating layer In3 is positioned on the first data conductive layer.

The third organic insulating layer In3 may include a general-purpose polymer such as polymethylmethacrylate (PMMA) or polystyrene (PS), a polymer derivative having a phenolic group, an acrylic polymer, an imide polymer, a polyimide, an acrylic polymer, a siloxane polymer, or the like. An organic insulating material may also be included.

An opening may be positioned in the third organic insulating layer In3, and a electrode of the transistor TFT is electrically connected to an anode.

An anode is positioned on the third organic insulating layer In3.

The anode is electrically connected to the transistor TFT through an opening of the third organic insulating layer In3.

The anode may include a metal such as silver (Ag), lithium (Li), calcium (Ca), aluminum (Al), magnesium (Mg), gold (Au), indium tin oxide (ITO), or indium. It may also include a transparent conductive oxide (TCO), such as zinc oxide (IZO).

The anode may be formed of a single layer including a metal material or a transparent conductive oxide. In some embodiments, the anode may be a multi-layer including the same.

A pixel defining layer PDL is positioned on the third organic insulating layer In3 and the anode.

The pixel defining layer PDL has an opening which overlaps at least a portion of the anode and defines an emission area.

The opening may have a substantially similar planar shape to that of the anode.

For example, the opening may have a rhombus or an octagonal shape similar to a rhombus in plan, but is not necessarily limited thereto and may have any shape such as a rectangle, a polygon, a circle, an ellipse, or the like.

The pixel definition layer (PDL) is an organic insulating material such as a general-purpose polymer. For example, the general-purpose polymer may include polymethylmethacrylate (PMMA) or polystyrene (PS), a polymer derivative having a phenolic group, an acrylic polymer, an imide polymer, a polyimide, an acrylic polymer, or a siloxane polymer.

A middle layer EL is positioned on the pixel defining layer PDL and the anode.

The middle layer EL may include a light emitting layer and a functional layer.

The light emitting layer of the middle layer EL generates light of a predetermined color so that the organic light emitting diode OLED can display one of the three primary colors of light.

In some embodiments, the organic light emitting diodes OLED may equally display white light or light of a specific wavelength band.

In this case, a color filter or a color conversion layer may be further included on the upper side of the organic light emitting diode OLED, enabling the display of an image as the light emitted from each organic light emitting diode OLED is transformed into one of the three primary colors of light.

The middle layer EL may include a structure where a plurality of light emitting layers and a plurality of functional layers are stacked (herein referred to as a tandem structure). When the organic light emitting diode OLED produces white light, the light emitted by light emitting layer and a functional layer is combined, resulting in the generation of white light.

The light emitting layer may include an organic material and/or an inorganic material.

The light emitting layer of this embodiment may be formed only in the opening of the pixel defining layer PDL.

The functional layer of the middle layer EL may include a hole injection layer, a hole transporting layer, an electron transporting layer, and/or an electron injection layer.

The functional layer may be divided into a first functional layer and a second functional layer. The first functional layer is positioned between the anode and the light emitting layer. The second functional layer is positioned between the light emitting layer and the cathode.

The functional layer may have a shape overlapping at least the surface of the substrate SUB.

The functional layer may be disposed over a plurality of pixels.

The cathode is positioned on the middle layer EL.

The cathode may include calcium (Ca), barium (Ba), magnesium (Mg), aluminum (Al), silver (Ag), platinum (Pt), palladium (Pd), gold (Au), and nickel (Ni). Reflective metals including neodymium (Nd), iridium (Ir), chromium (Cr), lithium (Li), and calcium (Ca), or transparent conductive oxides (TCO) such as indium tin oxide (ITO). The cathode may further include indium zinc oxide (IZO).

The cathode may have transflective properties.

The organic light emitting diode OLED may include the anode, the middle layer EL, and the cathode.

However, the embodiment is not necessarily limited thereto, and the upper and lower positions of the cathode and anode may be interchanged depending on the driving method of the light emitting display.

Holes and electrons are injected from the anode and the cathode, respectively, into the middle layer EL, and light is emitted when an exciton coupled with the injected holes and electrons falls from an excited state to a ground state.

The encapsulation substrate Encap1 is positioned on the cathode, and a space vc may be positioned between the cathode and the encapsulation substrate Encap1.

In the space vc, an inert gas such as nitrogen gas may be filled, or another optically transparent filler may be positioned.

Also, depending on the embodiment, an optically transparent planarization film or an adhesive for attaching the encapsulation substrate Encap1 may be positioned in the space vc.

In some embodiments, the encapsulation substrate Encap1 may be attached by a seal positioned around a display area displaying an image.

The encapsulation substrate Encap1 may be formed of optically isotropic glass or polymethyl methacrylate (PMMA).

Since the organic light emitting device may be vulnerable to moisture and oxygen, the encapsulation substrate Encap1 seals the organic light emitting device OLED and blocks the inflow of external moisture and oxygen.

A spacer may be further formed on the pixel defining layer PDL to maintain a distance from the encapsulation substrate. The spacer may be formed below the cathode.

Each pixel may include more than one transistor. For example, there may be two or more transistors in each pixel.

In some embodiments, an encapsulation layer may be formed by stacking an insulating film instead of the encapsulation substrate Encap1, which will be described through FIG. 10.

Unlike FIG. 9, in FIG. 10, an encapsulation layer Encap2 includes three insulating layers on the cathode instead of the encapsulation substrate (Encap1).

The encapsulation layer Encap2 is a layer for blocking moisture and oxygen flowing into the organic light emitting diode OLED. The encapsulation layer Encap2 may have a structure including a plurality of insulating layers, and a composite film including both an inorganic layer and an organic layer.

FIG. 10 shows an encapsulation layer Encap2. The encapsulation layer Encap2 includes three layers stacked sequentially: a first encapsulation inorganic layer Encap2-1, an encapsulation organic layer Encap2-2, and a second encapsulation inorganic layer Encap2-3.

The first encapsulation inorganic layer Encap2-1 covers the cathode and may include silicon nitride, silicon oxide, or an inorganic compound in which these are combined.

The encapsulation organic layer Encap2-2 is disposed on the first encapsulation inorganic layer Encap2-1 and may contact the first encapsulation inorganic layer Encap2-1.

The encapsulation organic layer may cover the curves formed on the upper surface of the first encapsulation inorganic layer Encap2-1 or particles present on the first encapsulation inorganic layer Encap2-1. The encapsulation organic layer Encap2-2 may have the effect of providing a flat surface.

The second encapsulation inorganic layer Encap2-3 is disposed on the encapsulation organic layer Encap2-2 and covers the encapsulation organic layer Encap2-2.

The second encapsulation inorganic layer Encap2-3 may include silicon nitride, silicon oxide, or an inorganic compound in which these are combined.

Meanwhile, in the embodiments of FIG. 7 and FIG. 8, the light emitting diode OLED may emit circularly polarized light, and may include a light emitting layer as shown in FIG. 11 and FIG. 12.

FIG. 11 and FIG. 12 are diagrams showing details of an example of a light emitting layer in a display panel of a head-mounted display device according to an embodiment.

Referring to FIG. 11, the light emitting layer may emit circularly polarized light by using a material included in a chiral luminophore.

FIG. 12 shows an example of five light emitting layers.

FIG. 12(A) briefly illustrates that the emission layer material can be formed by including fluorophores not having a chiral structure in a nano-template having a chiral structure.

FIG. 12(B) shows a method of combining a circularly polarized light emitter (CPL) with a DNA structure, and FIG. 12(C) shows a method of combining AIEgens, a biomaterial, to form a chiral nanotube to form circularly polarized light.

FIG. 12(D) illustrates a method where light is transmitted through a material formed by stacking multiple layers at a certain pitch, causing circular polarization. FIG. 12(E) demonstrates a method of emitting circularly polarized light (CPL) using ultraviolet (UV) light by combining polyvinyl alcohol (PVA), cellulose nanocrystal (CNC) and carbon dots (CD).

The method shown in FIG. 12 is an example of various methods, and the present invention is not necessarily limited thereto.

In the above, as shown in FIG. 1, the optical system 200 includes two curved lenses 210 and 220, and optical films 211, 212, 221 and 222 are formed on both surfaces of each curved lens, respectively.

In some embodiments, the optical system 200 may include only one curved lens or may include three or four curved lenses.

At this time, various optical films may be attached to both sides of each curved lens.

Although the embodiments have been described in detail above, the scope is not necessarily limited thereto, and various modifications made by those skilled in the art using the basic concepts of the present invention defined in the following claims are also included in the scope of the present invention.

What is claimed is:

1. A head-mounted display device, comprising:
a display panel; and
an optical system disposed in front of the display panel,
wherein the display panel includes:
a light emitting device unit,
a first cholesteric liquid crystal layer, a second cholesteric liquid crystal layer, and a third cholesteric liquid crystal layer disposed on the front surface of the light emitting device unit;

an upper light blocking layer disposed between two of the first cholesteric liquid crystal layer, the second cholesteric liquid crystal layer, and the third cholesteric liquid crystal layer;
a retardation plate disposed on front surfaces of the first cholesteric liquid crystal layer, the second cholesteric liquid crystal layer, the third cholesteric liquid crystal layer, and the upper light blocking layer; and
an absorption-type polarizer disposed in front of the retardation plate,
wherein the first cholesteric liquid crystal layer, the second cholesteric liquid crystal layer, and the third cholesteric liquid crystal layer have different wavelength values according to the following equation:

$$\text{wavelength} = n \times \text{pitch value}$$

where, n is a refractive index value, and the pitch value is a pitch value of liquid crystal molecules of the first cholesteric liquid crystal layer, the second cholesteric liquid crystal layer, or the third cholesteric liquid crystal layer.

2. The head-mounted display device of claim 1, wherein:
the first cholesteric liquid crystal layer has a wavelength value within a range of from 600 nm to 700 nm, the second cholesteric liquid crystal layer has a wavelength value of 500 nm or more and less than 600 nm, and the third cholesteric liquid crystal layer has a wavelength value of 400 nm or more and less than 500 nm.

3. The head-mounted display device of claim 2, wherein:
the first cholesteric liquid crystal layer transmits circularly polarized light in one direction and reflects circularly polarized light in the opposite direction a light with a wavelength of 600 nm to 700 nm,
the second cholesteric liquid crystal layer transmits circularly polarized light in one direction and reflects circularly polarized light in the opposite direction a light with wavelength of 500 nm or more and less than 600 nm, and
the third cholesteric liquid crystal layer of a head-mounted display device that transmits circularly polarized light in one direction and reflects circularly polarized light in the opposite direction among light with a wavelength within a range of from 400 nm to 500 nm.

4. The head-mounted display device of claim 3, wherein:
the absorption-type polarizer of the display panel has an absorption axis, absorbs polarized light of the absorption axis, and transmits polarized light perpendicular to the absorption axis, and
the retardation plate of the display panel has a first retardation axis, and a head-mounted display device that retards light in the direction of the first retardation axis by λ/4 to change linearly polarized light into circularly polarized light or converts circularly polarized light into linearly polarized light.

5. The head-mounted display device of claim 4, wherein:
the first retardation axis is disposed at a 45-degree angle to the absorption axis of the absorption-type polarizer.

6. The head-mounted display device of claim 4, wherein:
the optical system includes:
a first curved lens including a first retardation plate disposed on an inner surface and a beam splitter disposed on an outer surface;
a second curved lens including a second retardation plate disposed on an inner surface and a reflective polarizing plate disposed on an outer surface, and the first curved lens is disposed on the display panel, and the second curved lens is disposed on the first curved lens.

7. The head-mounted display device of claim 6, wherein:

the reflective polarizing plate of the second curved lens has a reflection axis, reflects polarized light of the reflection axis and transmits polarized light perpendicular to the reflection axis, the first retardation plate of the first curved lens has a second delay axis, and delays light in the direction of the second delay axis by $\lambda/4$ to change linearly polarized light into circularly polarized light or change circularly polarized light into linearly polarized light, and the second retardation plate of the second curved lens has a third delay axis, and delays light in the direction of the third delay axis by $\lambda/4$ to change linearly polarized light into circularly polarized light or change circularly polarized light into linearly polarized light.

8. The head-mounted display device of claim 7, wherein:

the reflection axis of the reflective polarizing plate is parallel to the absorption axis, and the second delay axis and the third delay axis are disposed at 45 degrees angle to the absorption axis and the reflection axis.

9. The head-mounted display device of claim 7, wherein:

the beam splitter of the first curved lens reflects half of the incident light and transmits the remaining half of the incident light.

10. The head-mounted display device of claim 1, wherein:

the light emitting device unit includes an anode, a middle layer including a light emitting layer, and a light emitting diode including a cathode, and the cathode reflects half of the light incident from the front surface, and the anode reflects all light incident from the front surface.

11. The head-mounted display device of claim 10, wherein:

the light emitting device unit further includes a first color filter, a second color filter, and a third color filter disposed in front of the light emitting diode, the first color filter overlaps the first cholesteric liquid crystal layer, the second color filter overlaps the second cholesteric liquid crystal layer on a plane, and the third color filter overlaps the third cholesteric liquid crystal layer on a plane.

12. The head-mounted display device of claim 11, comprising:

a light blocking layer disposed between two color filters of the first color filter, the second color filter, and the third color filter.

13. The head-mounted display device of claim 10, wherein:

the display panel further includes:

an encapsulation substrate to block the inflow of moisture or air into the light emitting layer, and the encapsulation substrate is disposed on the cathode.

14. The head-mounted display device of claim 10, wherein:

the display panel further includes an encapsulation layer blocking moisture or air from entering the light emitting layer; and the encapsulation layer includes, a first encapsulation inorganic layer, an encapsulation organic layer, and a second encapsulation inorganic layer, the first encapsulation inorganic layer, the encapsulation organic layer, and the second encapsulation inorganic layer are sequentially stacked.

* * * * *